(12) United States Patent
Kwon et al.

(10) Patent No.: US 8,531,896 B2
(45) Date of Patent: Sep. 10, 2013

(54) SEMICONDUCTOR SYSTEM, SEMICONDUCTOR MEMORY APPARATUS, AND METHOD FOR INPUT/OUTPUT OF DATA USING THE SAME

(75) Inventors: Yong Kee Kwon, Icheon-si (KR); Hyung Dong Lee, Icheon-si (KR); Young Suk Moon, Icheon-si (KR); Hyung Gyun Yang, Icheon-si (KR); Sung Wook Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 102 days.

(21) Appl. No.: 13/219,656

(22) Filed: Aug. 27, 2011

(65) Prior Publication Data

US 2012/0140584 A1 Jun. 7, 2012

(30) Foreign Application Priority Data

Dec. 1, 2010 (KR) ........................ 10-2010-0121183

(51) Int. Cl.
*G11C 7/00* (2006.01)
*G11C 7/22* (2006.01)
*G11C 11/22* (2006.01)

(52) U.S. Cl.
CPC . *G11C 7/22* (2013.01); *G11C 11/22* (2013.01)
USPC ........ 365/193; 365/194; 365/201; 365/233.1; 365/189.07; 365/189.09

(58) Field of Classification Search
CPC ............ G11C 29/56; G06F 13/16; G06F 9/34
USPC ............ 365/194, 201, 233.1, 189.1, 189.07, 365/189.09
See application file for complete search history.

(56) References Cited

U.S. PATENT DOCUMENTS 7,636,828 B2 12/2009 VanZante et al.
2010/0296352 A1* 11/2010 Choi et al. .................... 365/194

FOREIGN PATENT DOCUMENTS

| JP | 2000-173267 | 6/2000 |
| KR | 1020040011834 A | 2/2004 |
| KR | 1020070049241 A | 5/2007 |
| KR | 100744125 B1 | 7/2007 |

\* cited by examiner

*Primary Examiner* — Thong Q Le
(74) *Attorney, Agent, or Firm* — William Park & Associates Patent Ltd.

(57) ABSTRACT

A semiconductor system, a semiconductor memory apparatus, and a method for input/output of data using the same are disclosed. The semiconductor system includes a controller and a memory apparatus where the controller is configured to transmit a clock signal, a data output command, an address signal, and a second strobe signal to a memory apparatus. The memory apparatus is configured to provide data to the controller in synchronization with the second strobe signal, and in response to the clock signal, the data output command, the address signal, and the second strobe signal received from the controller.

20 Claims, 5 Drawing Sheets

SEMICONDUCTOR SYSTEM, SEMICONDUCTOR MEMORY APPARATUS, AND METHOD FOR INPUT/OUTPUT OF DATA USING THE SAME

CROSS-REFERENCES TO RELATED APPLICATION

The present application claims priority under 35 U.S.C. §119(a) to Korean application number 10-2010-0121183, filed on Dec. 1, 2010 in the Korean Intellectual Property Office, and which is incorporated by reference in its entirety.

BACKGROUND

1. Technical Field

The present invention relates to a semiconductor apparatus, and more particularly, to a semiconductor system, a semiconductor memory apparatus, and a method for input/output of data using the same.

2. Related Art

In general, synchronous memory apparatuses operating in synchronization with an external system clock have been used to improve the operation speed of a semiconductor system. The synchronous memory apparatuses have evolved from single data rate (SDR) memory apparatuses into double data rate (DDR) memory apparatuses. The SDR memory apparatuses are configured to input/output data over one cycle of a clock in synchronization with a rising edge of the clock. The DDR memory apparatuses are configured to input/output data in synchronization with a rising edge and a falling edge of a clock.

It is important to accurately synchronize a controller and a memory apparatus in a data input operation of a memory system using a DDR memory apparatus. To this end, data are transmitted from the controller to the memory apparatus in synchronization with a data input strobe signal. In a data output operation, the memory apparatus generates a data output strobe signal in response to a data output command, that is, a read (RD) command received from the controller. The memory apparatus transmits data to the controller in synchronization with the data output strobe signal.

FIG. 1 is a diagram illustrating a protocol in a general semiconductor system.

Referring to FIG. 1, a general semiconductor system 10 includes a controller 12 and at least one memory apparatus 14.

The controller 12 provides a clock signal CLK, a command CMD, and an address signal ADD to the memory apparatus 14. Also, the controller 12 provides data DATA to the memory apparatus 14 in synchronization with a data input/output strobe signal DQS in response to a data input command. The memory device 14 provides data DATA to the controller 12 in synchronization with the data input/output strobe signal DQS in response to a data output command received from the memory device 14.

FIGS. 2 and 3 are timing diagrams illustrating a data input/output operation in the semiconductor system 10 illustrated in FIG. 1.

FIG. 2 is a timing diagram illustrating a data input operation in the semiconductor system 10 illustrated in FIG. 1.

Referring to FIG. 2, the data input/output strobe signal DQS has the same phase as the clock signal CLK. The controller 12 provides data DATA to the memory apparatus 14 in synchronization with the data input/output strobe signal DQS. Specifically, the controller 12 transmits data to the memory apparatus 14 by synchronizing a center of the data with an edge of the data input/output strobe signal DQS.

That is, when storing data in the memory apparatus 14, the controller 12 transmits the data to the memory apparatus 14 not by synchronizing a falling edge or a rising edge of the data with a falling edge or a rising edge of the data input/output strobe signal DQS, but by synchronizing a center of the data with a falling edge or a rising edge of the data input/output strobe signal DQS. Thus, there is a sufficient margin for synchronizing the data input/output strobe signal DQS and the input data in the memory apparatus 14.

FIG. 3 is a timing diagram illustrating a data output operation in the semiconductor system 10 illustrated in FIG. 1.

Referring to FIG. 3, the memory apparatus 14 generates the data input/output strobe signal DQS by using the clock signal CLK in response to the data output command received from the controller 12. Then, the memory apparatus 14 outputs the data input/output strobe signal DQS after a predetermined delay time. Also, the memory apparatus 14 outputs data DATA to the controller 12 by synchronizing a rising edge and a falling edge of the data with a rising edge and a falling edge of the delayed data input/output strobe signal DQS. At this point, the delayed data input/output strobe signal DQS is also transmitted to the controller 12.

The controller 12 uses an internal delay circuit to shift the phase of the data input/output strobe signal DQS, received from the memory apparatus 14, by 90° so that an edge of the data outputted from the memory apparatus 14 is synchronized with the center of the data input/output strobe signal DQS. That is, the phase of the data input/output strobe signal DQS received from the memory apparatus 14 is controlled to improve the data output margin.

If the memory apparatus 14 includes a clock synchronization circuit such as a phase-locked loop (PLL) circuit or a delay-locked loop (DLL) circuit, the memory apparatus 14 may transmit data to the controller 12 by synchronizing an edge of the data with the center of the data input/output strobe signal DQS. However, a PLL circuit or a DLL circuit consumes a large amount of power and is not suitable for application to low-power devices such as mobile devices.

Therefore, the controller 12 must control the phase of the data input/output strobe signal DQS in a data output operation. However, in this case, the controller 12 must latch the data received from the memory apparatus 14, shift the phase of the data input/output strobe signal DQS, and then output the data by synchronizing an edge of the data with the center of the data input/output strobe signal DQS. Therefore, the controller 12 must have a PLL circuit, thus increasing the total power consumption of the memory system 10.

In addition, the operation speed of the memory system 10 decreases and the operation load of the controller 12 increases. These problems become more severe as the data processing rate increases.

Furthermore, when the controller 12 changes from a power-down mode to an active mode for a data output operation, it increases a clock signal activation time for driving the PLL circuit to control the phase of the data input/output strobe signal DQS and a clock signal deactivation time for returning to the power-down mode after completion of the data output operation. This obstructs an increase in the bandwidth of the memory system 10, and impedes an increase in the operation speed of the memory system 10.

SUMMARY

In one embodiment of the present invention, a semiconductor system includes a controller configured to transmit a clock signal, a data output command, an address signal, and a second strobe signal to a memory apparatus. The memory apparatus may be configured to provide data to the controller in synchronization with the second strobe signal, and in response to the clock signal, the data output command, the address signal, and the second strobe signal received from the controller.

In another embodiment of the present invention, a semiconductor memory apparatus operating under the control of a controller includes a memory cell array, a strobe signal control circuit configured to receive a data output command and a second strobe signal from the controller and generate a third strobe signal, and an input/output control circuit configured to output data read from the memory cell array in synchronization with the third strobe signal and in response to the data output command.

In another embodiment of the present invention, a method for outputting data in a semiconductor system including a controller and a memory apparatus operating under the control of the controller includes transmitting a data output command and a second strobe signal from the controller to the memory apparatus, and transmitting read data to the controller in synchronization with the second strobe signal and in response to the data output command received from the controller.

BRIEF DESCRIPTION OF THE DRAWINGS

Features, aspects, and embodiments are described in conjunction with the attached drawings, in which.

DETAILED DESCRIPTION

A semiconductor system, a semiconductor memory apparatus, and a method for input/output of data using the same according to embodiments of the present invention will be described below with reference to the accompanying drawings.

Figure 1:
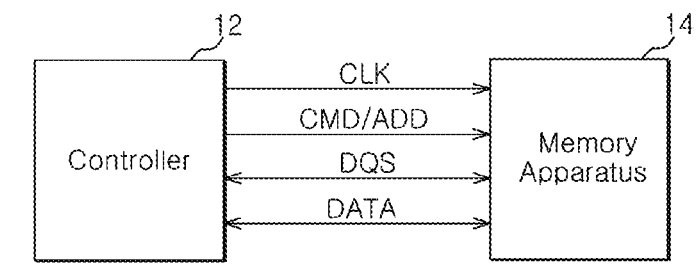
FIG. 1 is a diagram illustrating a protocol in a general semiconductor system.
Figure 2:
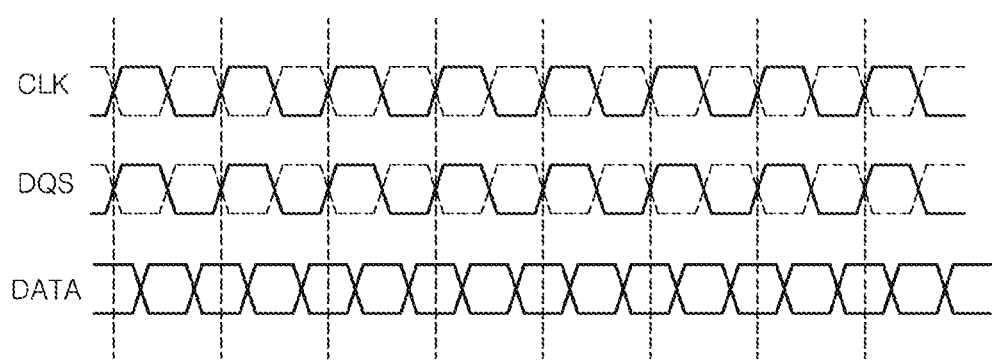
FIGS. 2 and 3 are timing diagrams illustrating a data input/output operation in the semiconductor system illustrated in FIG. 1.
Figure 3:
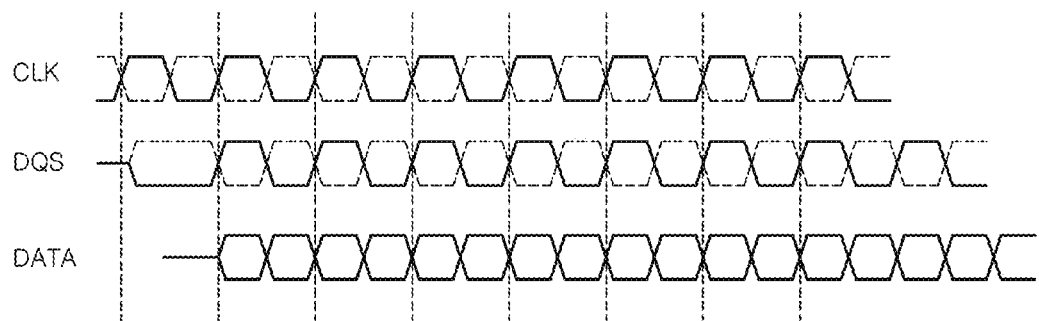
Figure 4:
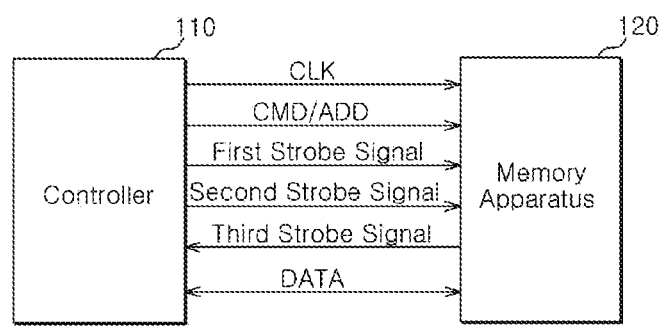
FIG. 4 is a block diagram of a semiconductor system according to an exemplary embodiment of the present invention.

FIG. 4 is a block diagram of a semiconductor system according to an exemplary embodiment of the present invention.

Referring to FIG. 4, a semiconductor system 100 includes a controller 110 and at least one memory apparatus 120.

The controller 110 transmits a clock signal CLK, a command CMD, and an address signal ADD to the memory apparatus 120 through a transmission line. Also, the controller 110 generates a first strobe signal from the clock signal CLK, generates a second strobe signal based on the first strobe signal, and transmits the second strobe signal to the memory apparatus 120.

The memory apparatus 120 performs a predetermined operation according to the clock signal CLK, the command CMD, the address signal ADD, the first strobe signal, and the second strobe signal received from the controller 110. In particular, when receiving a data input command, an address signal, and data synchronized with the first strobe signal from the controller 110, the memory apparatus 120 writes the data in a memory cell corresponding to the address signal. The controller 110 transmits the data to the memory apparatus 120 by synchronizing an edge of the data with the center of the first strobe signal.

Also, when receiving a data output command, an address signal, and the second strobe signal from the controller 110, the memory apparatus 120 reads data from a memory cell corresponding to the address signal. The memory apparatus 120 outputs the read data in synchronization with the second strobe signal. To this end, the memory apparatus 120 generates a third strobe signal from the second strobe signal received from the controller 110. Also, the memory apparatus 120 transmits the third strobe signal to the controller 110, and outputs data to the controller 110 by synchronizing an edge of the data with the center of the third strobe signal.

In an exemplary embodiment, the second strobe signal may be activated and provided to the memory apparatus 120 when or after the data output command is enabled. If the second strobe signal is activated after the data output command is enabled, the activation time of the second strobe signal may be determined in consideration of the time taken to sense data in the memory apparatus 120.

In a data output operation, because the memory apparatus 120 transmits data to the controller 110 by synchronizing an edge of the data with the center of the third strobe signal, the controller 110 need not shift the phase of the third strobe signal. Therefore, the data output margin improves and the bandwidth increases. Also, the data processing rate increases because the data transmitted in synchronization with the center of the third strobe signal can be directly transmitted to data-requesting master blocks (e.g., CPUs, DSPs, and hardware engines).

In an exemplary embodiment, the first strobe signal may have the same phase as the clock signal CLK, and the second strobe signal may be outputted by delaying the first strobe signal by a predetermined time. Also, the second strobe signal may be generated by delaying the first strobe signal such that the second strobe signal has a phase difference of 90° with respect to the first strobe signal. Also, the third strobe signal may have the same phase as the second strobe signal.

Figure 5:
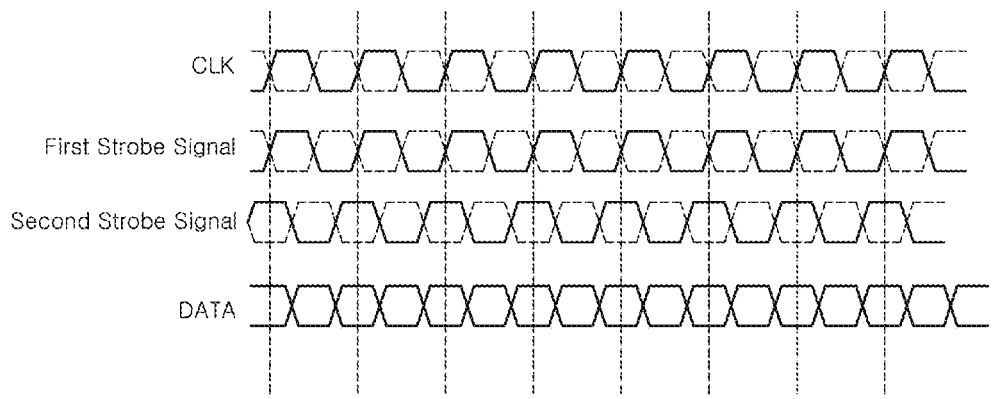
FIGS. 5 and 6 are timing diagrams illustrating a data input/output operation in the semiconductor system illustrated in FIG. 4.
Figure 6:
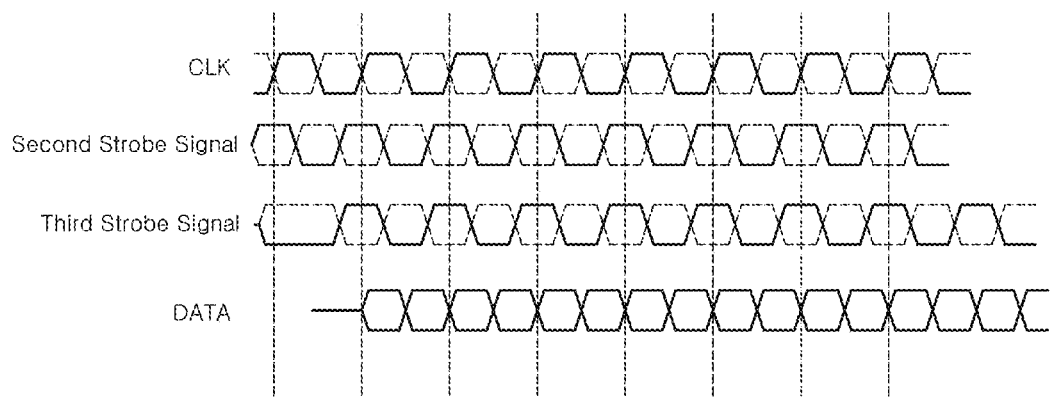

FIGS. 5 and 6 are timing diagrams illustrating a data input/output operation in the semiconductor system 100 illustrated in FIG. 4.

FIG. 5 is a timing diagram illustrating a data input operation in the semiconductor system 100 illustrated in FIG. 4.

Referring to FIG. 5, the controller 110 transmits a command, an address signal, a clock signal CLK, and a first strobe signal to the memory apparatus 120 in a data input operation. Also, the controller 110 transmits data to the memory apparatus 120 by synchronizing an edge of the data with the center of the first strobe signal.

Accordingly, the memory apparatus 120 stably receives the data synchronized with the center of the first strobe signal, and writes the received data in the corresponding memory cell.

FIG. 6 is a timing diagram illustrating a data output operation in the semiconductor system 100 illustrated in FIG. 4.

Referring to FIG. 6, the controller 110 provides a command, an address signal, a clock signal CLK, and a second strobe signal to the memory apparatus 120 in a data output operation. Like the clock signal, the second strobe signal may be always provided to the memory apparatus 120 or may be provided to the memory apparatus 120 only in a data output operation.

The memory apparatus 120 reads data from a memory cell in response to a data output command received from the controller 110. Also, the memory apparatus 120 generates a third strobe signal having the same phase as a second strobe signal received from the controller 110, and transmits data to the controller 110 by synchronizing an edge of the data with the center of the third strobe signal. At this point, the third strobe signal is also transmitted to the controller 110.

Both of the data input/output operations are performed in synchronization with the center of the strobe signal. Thus, the data input/output margin increases as compared to the case of inputting/outputting data in synchronization with the falling/rising edge. Consequently, the data input/output bandwidth can be improved, thus enabling a high-speed operation of the memory system 100.

It may be noted that while data has been described as being in synchronization with the center of a strobe signal, it may also be described as the center of data being synchronized to an edge of the first, second, and third strobe signals.

Also, the strobe signal for synchronizing the output data in the data output operation is generated not by using the phase control circuit (e.g., PLL or DLL) of the memory apparatus 120 or the controller 110 but by delaying the strobe signal for the data input operation. Thus, there is no need to activate/deactivate the phase control circuit (e.g., PLL or DLL) in the data output operation. Therefore, the semiconductor system 100 performs a stable operation with low power consumption.

Figure 7:
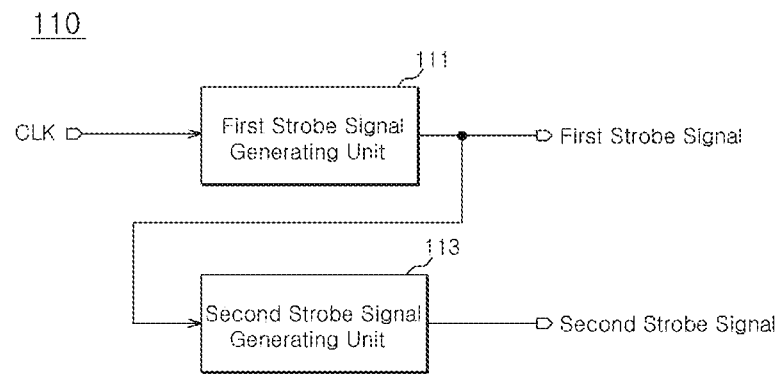
FIG. 7 is a block diagram illustrating an example of a controller illustrated in FIG. 4.

FIG. 7 is a block diagram illustrating an example of the controller 110 illustrated in FIG. 4.

Referring to FIG. 7, the controller 110 includes a first strobe signal generating unit 111 and a second strobe signal generating unit 113.

In response to a clock signal CLK, the first strobe signal generating unit 111 generates a first strobe signal having the same cycle as the clock signal CLK.

In response to the first strobe signal, the second strobe signal generating unit 113 generates a second strobe signal by delaying the first strobe signal. The second strobe signal generating unit 113 may delay the first strobe signal such that the first strobe signal and the second strobe signal have a phase difference of, for example, 90°. The second strobe signal generating unit 113 may be configured using, for example, a typical delay circuit, a pulse generator, or a phase shifter.

Figure 8:
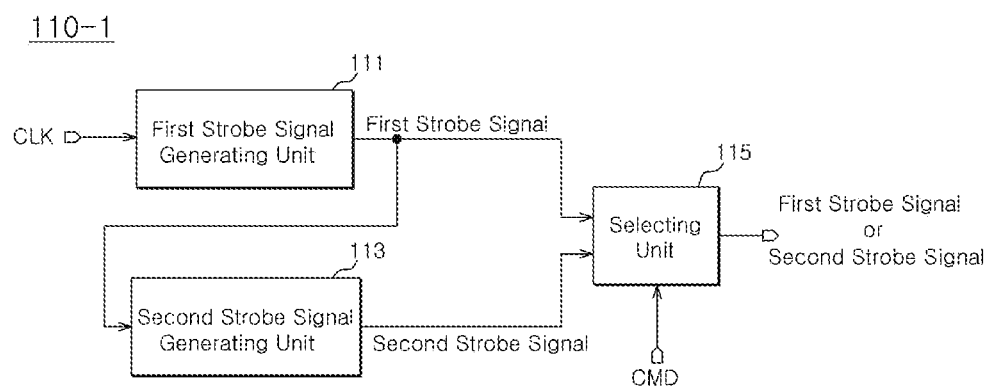
FIG. 8 is a block diagram illustrating another example of the controller illustrated in FIG. 4.

FIG. 8 is a block diagram illustrating another example 110-1 of the controller 110 illustrated in FIG. 4.

Referring to FIG. 8, the controller 110-1 includes a first strobe signal generating unit 111, a second strobe signal generating unit 113, and a selecting unit 115. The selecting unit 115 receives an output signal of the first strobe signal generating unit 111 and an output signal of the second strobe signal generating unit 113, and outputs a first strobe signal or a second strobe signal in response to a command CMD.

According to this configuration, the second strobe signal for a data output operation of the memory apparatus 120 can be provided without increasing the number of transmission lines between the controller 110-1 and the memory apparatus 120.

Figure 9:
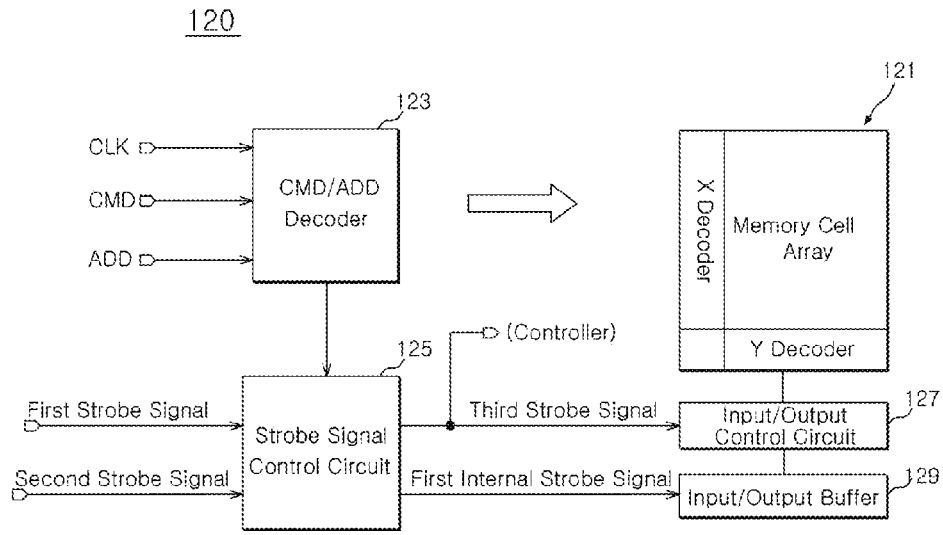
FIG. 9 is a block diagram illustrating an example of a memory apparatus illustrated in FIG. 4.

FIG. 9 is a block diagram illustrating an example of the memory apparatus 120 illustrated in FIG. 4.

Referring to FIG. 9, the memory apparatus 120 includes a core region 121, a command/address (CMD/ADD) decoder 123, a strobe signal control circuit 125, an input/output control circuit 127, and an input/output buffer 129.

The core region 121 includes a memory cell array, an X decoder, and a Y decoder. The memory cell array includes a plurality of memory cells connected between bit lines and word lines.

The CMD/ADD decoder 123 receives a clock signal CLK, a command CMD, and an address signal ADD from the controller 110 to generate an internal clock signal, an internal command, and an internal address signal. The output signal of the CMD/ADD decoder 123 is provided to the corresponding chip set of the memory apparatus 120, such as the core region 121, the strobe signal control unit 125, and the input/output control circuit 127.

The strobe signal control unit 125 receives the first strobe signal and the second strobe signal from the controller 110 and receives the internal command from the CMD/ADD decoder 123 to generate a first internal strobe signal or a third strobe signal. If the command received from the CMD/ADD decoder 123 is a data input command, the strobe signal control circuit 125 generates a first internal strobe signal and provides the first internal strobe signal to the input/output buffer 129. Accordingly, the input/output buffer 129 receives data with an edge synchronized with the center of the first internal strobe signal, from the controller 110.

On the other hand, if the command received from the CMD/ADD decoder 123 is a data output command, the strobe signal control circuit 125 generates a third strobe signal from the second strobe signal. When the input/output control circuit 127 reads data from the memory cell array in response to the data output command, the data with an edge synchronized with the center of the third strobe signal are transmitted through the input/output buffer 129 to the controller 110. At this point, the strobe signal control circuit 125 also transmits the third strobe signal to the controller 110.

Figure 10:
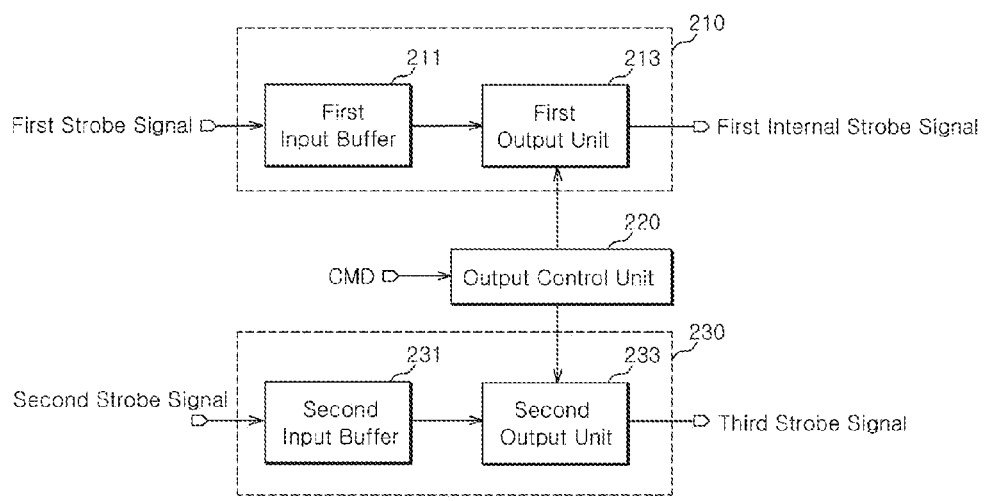
FIG. 10 is a block diagram illustrating an example of a strobe signal control circuit illustrated in FIG. 9.

FIG. 10 is a block diagram illustrating an example of the strobe signal control circuit 125 illustrated in FIG. 9.

Referring to FIG. 10, the strobe signal control circuit 125 includes a first signal generating unit 210, a second signal generating unit 230, and an output control unit 220. The output control unit 220 controls the output time points of the first and second signal generating units 210 and 230.

The first signal generating unit 210 includes a first input buffer 211 and a first output unit 213. The first input buffer 211 receives the first strobe signal from the controller 110, and converts the level of the first strobe signal to an internal signal level. When the level of the first strobe signal is converted to the internal signal level, the first output unit 213 outputs a first internal strobe signal in response to the output signal of the output control unit 220.

The second signal generating unit 230 includes a second input buffer 231 and a second output unit 233. The second input buffer 231 receives the second strobe signal from the controller 110, and converts the level of the second strobe signal to an internal signal level. In response to the output signal of the output control unit 220, the second output unit 233 outputs the second strobe signal converted to the internal signal level as a third strobe signal.

If the command CMD received from the CMD/ADD decoder 123 is a data input command, the output control unit 220 drives the first output unit 213 to output the first internal strobe signal. On the other hand, if the command CMD received from the CMD/ADD decoder 123 is a data output command, the output control unit 220 drives the second output unit 233 to output the third strobe signal.

As described above, in an exemplary embodiment of the present invention, the controller 110 generates a second strobe signal by delaying a first strobe signal by a predetermined time, and provides the second strobe signal to the memory apparatus 120. Herein, the second strobe signal is generated from the first strobe signal without using a clock signal, and it may be implemented without using a separate phase control circuit such as a PLL or a DLL. The second strobe signal is provided from the controller 110 to the memory apparatus 120 in a read operation. In a data output operation, the memory apparatus 120 outputs data by synchronizing an edge of the data with the center of the third strobe signal generated from the second strobe signal.

A controller or a memory apparatus must include a phase control circuit such as a PLL or a DLL in order to synchronize data with the center of a strobe signal in a data output operation. However, the PLL or the DLL consumes a large amount of power, thus increasing the load of the semiconductor system 10 and reducing the operation speed thereof.

However, in various embodiments of the present invention, the controller 110 generates a second strobe signal by delaying a first strobe signal for a data input operation by a predetermined time, and provides the second strobe signal to the memory apparatus 120. Also, in a data output operation, the memory apparatus 120 outputs data in synchronization with the center of a third strobe signal generated from the second strobe signal. Therefore, various embodiments of the present invention can improve the data output margin even without using a high-power circuit such as a PLL or a DLL.

In order to achieve high integration and miniaturization, semiconductor memory apparatuses are developing into a three-dimensional stack structure using micro bumps and a through-silicon via (TSV) structure. Using the data output method of various embodiments of the present invention in the high-integration memory apparatus can greatly improve the data output margin as compared to the case of outputting data in synchronization with the falling/rising edge.

In addition, various embodiments of the present invention are also applicable to unstandardized memory apparatuses, and data can be bidirectionally transmitted between the memory apparatus and the controller in synchronization with the center of the strobe signal. Furthermore, the data input/output method can be implemented without using a high-power circuit such as a PLL or a DLL, thus making it possible to reduce the power consumption and the fabrication cost.

While certain embodiments have been described above, it will be understood to those skilled in the art that the embodiments described are by way of example only. Accordingly, the semiconductor system, the semiconductor memory apparatus, and the method for input/output of data using the same described herein should not be limited based on the described embodiments. Rather, the semiconductor system, the semiconductor memory apparatus, and the method for input/output of data using the same described herein should only be limited in light of the claims that follow when taken in conjunction with the above description and accompanying drawings.

What is claimed:

1. A semiconductor system comprising:
    a controller configured to transmit a clock signal, a data output command, an address signal, and a second strobe signal to a memory apparatus; and
    the memory apparatus configured to provide data to the controller in synchronization with the second strobe signal in response to the clock signal, the data output command, the address signal, and the second strobe signal received from the controller,
    wherein the second strobe signal is generated in the controller in response to the clock signal.

2. The semiconductor system according to claim 1, wherein the controller comprises;
    a first strobe signal generating unit configured to generate a first strobe signal in response to the clock signal; and
    a second strobe signal generating unit configured to generate the second strobe signal by delaying the first strobe signal by a predetermined time.

3. The semiconductor system according to claim 2, wherein the second strobe signal generating unit is one of: a delay circuit, a pulse generator, and a phase shifter.

4. The semiconductor system according to claim 2, wherein the second strobe signal has a predetermined phase difference with respect to the first strobe signal.

5. The semiconductor system according to claim 2, further comprising a selecting unit configured to select the output signal of the first strobe signal generating unit or the output signal of the second strobe signal generating unit in response to an applied command.

6. The semiconductor system according to claim 1, wherein the memory apparatus generates a third strobe signal from the second strobe signal having the same phase as the second strobe signal.

7. The semiconductor system according to claim 6, wherein the memory apparatus outputs the third strobe signal and data to the controller by synchronizing an edge of the data with a center of the third strobe signal.

8. The semiconductor system according to claim 1, wherein the second strobe signal is activated when the data output command is enabled.

9. The semiconductor system according to claim 1, wherein the second strobe signal is activated after the data output command is enabled.

10. The semiconductor system according to claim 1, wherein the memory apparatus comprises:
    a command/address decoder configured to receive the data output command and the address signal from the controller and convert the same into an internal signal; and
    a strobe signal control circuit configured to generate a third strobe signal in response to the second strobe signal received from the controller and the internal signal outputted from the command/address decoder.

11. The semiconductor system according to claim 10, wherein the strobe signal control circuit comprises;
    a first signal generating unit configured to receive a data input command and a first strobe signal from the controller and generate a first internal strobe signal from the first strobe signal; and
    a second signal generating unit configured to receive the data output command and the second strobe signal from the controller and generate a third strobe signal from the second strobe signal.

12. A semiconductor memory apparatus operating under the control of a controller, comprising:
    a memory cell array;
    a strobe signal control circuit configured to receive a data output command and a second strobe signal from the controller and generate a third strobe signal; and
    an input/output control circuit configured to provide data, read from the memory cell array, to the controller in synchronization with the third strobe signal in response to the data output command,
    wherein the second strobe signal is generated in the controller in response to the clock signal.

13. The semiconductor memory apparatus according to claim 12, wherein the strobe signal control circuit comprises:
- a first signal generating unit configured to receive a data input command and a first strobe signal from the controller and generate a first internal strobe signal from the first strobe signal; and
- a second signal generating unit configured to receive the data output command from the controller and generate the third strobe signal from the second strobe signal.

14. The semiconductor memory apparatus according to claim 13, wherein the second signal generating unit generates the third strobe signal based on the second strobe signal having the same phase as the second strobe signal.

15. The semiconductor memory apparatus according to claim 14, wherein the input/output control circuit outputs the third strobe signal and data to the controller by synchronizing an edge of the data with the center of the third strobe signal.

16. A method for outputting data in a semiconductor system including a controller and a memory apparatus operating under the control of the controller, comprising:
- generating a second strobe signal by the controller in response to a clock signal;
- transmitting a data output command and the second strobe signal from the controller to the memory apparatus; and
- transmitting read data from the memory apparatus to the controller in synchronization with the second strobe signal in response to the data output command received from the controller.

17. The method according to claim 16, wherein the second strobe signal is generated by the controller delaying a first strobe signal by a predetermined time.

18. The method according to claim 16, further comprising generating a third strobe signal from the second strobe signal by the memory apparatus,
- wherein when the read data is transmitted the memory apparatus transmits the third strobe signal and the read data to the controller in synchronization with the third strobe signal.

19. The method according to claim 18, wherein the third strobe signal has the same phase as the second strobe signal.

20. The method according to claim 18, wherein the read data is transmitted to the controller by synchronizing an edge of the data with the center of the third strobe signal.

* * * * *